United States Patent
Kim

(10) Patent No.: US 8,232,149 B2
(45) Date of Patent: Jul. 31, 2012

(54) SOI DEVICE HAVING AN INCREASING CHARGE STORAGE CAPACITY OF TRANSISTOR BODIES AND METHOD FOR MANUFACTURING THE SAME

(75) Inventor: Bo Youn Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 193 days.

(21) Appl. No.: 12/329,926

(22) Filed: Dec. 8, 2008

(65) Prior Publication Data

US 2009/0218624 A1    Sep. 3, 2009

(30) Foreign Application Priority Data

Feb. 29, 2008   (KR) .................. 10-2008-0018899

(51) Int. Cl.
*H01L 21/00* (2006.01)
*H01L 21/84* (2006.01)

(52) U.S. Cl. . 438/157; 438/151; 438/391; 257/E21.561; 257/E21.562; 257/E21.571

(58) Field of Classification Search .................. 438/282, 438/149–166, 295, 311, 404–413, 458–459, 438/479–481, 967; 257/349, E21.561, E21.562, 257/E21.571

See application file for complete search history.

(56) References Cited

U.S. PATENT DOCUMENTS

| | | | | |
|---|---|---|---|---|
| 7,709,320 B2 * | 5/2010 | Cheng et al. | ................... | 438/243 |
| 2002/0153590 A1 * | 10/2002 | Kunikiyo | ................... | 257/532 |
| 2004/0018668 A1 * | 1/2004 | Maszara | ................... | 438/149 |
| 2004/0115927 A1 * | 6/2004 | Wu et al. | ................... | 438/638 |
| 2008/0035962 A1 * | 2/2008 | Kim et al. | ................... | 257/288 |
| 2009/0256194 A1 * | 10/2009 | Kim et al. | ................... | 257/330 |

FOREIGN PATENT DOCUMENTS

| KR | 1020010064961 A | 7/2001 |
|---|---|---|
| KR | 1020070010835 A | 1/2007 |

\* cited by examiner

*Primary Examiner* — Julio J Maldonado
*Assistant Examiner* — Sonya D McCall Shepard
(74) *Attorney, Agent, or Firm* — Ladas & Parry LLP

(57) ABSTRACT

An SOI device includes an SOI substrate having a stacked structure including a buried oxide layer and a first silicon layer sequentially stacked on a silicon substrate. The SOI substrate possesses grooves having a depth that extends from an upper surface of the first silicon layer to a partial depth of the buried oxide layer. An insulation layer is formed on the lower surfaces of the grooves and a second silicon layer is formed filling the grooves having the insulation layer formed thereon. Gates are formed on the second silicon layer and junction regions are formed in the first silicon layer on both sides of the gates to contact the insulation layer.

6 Claims, 4 Drawing Sheets

SOI DEVICE HAVING AN INCREASING CHARGE STORAGE CAPACITY OF TRANSISTOR BODIES AND METHOD FOR MANUFACTURING THE SAME

CROSS-REFERENCE TO RELATED APPLICATIONS

The present application claims priority to Korean patent application number 10-2008-0018899 filed on Feb. 29, 2008, which is incorporated herein by reference in its entirety.

BACKGROUND OF THE INVENTION

The present invention relates to an SOI device and a method for manufacturing the same, and more particularly, to an SOI device that can increase a charge storage capacity and improve the operation characteristics of transistors and a method for manufacturing the same.

As semiconductor devices become more highly integrated, operate at higher speeds, and lower power consumption, a semiconductor device (hereinafter referred to as an "SOI device") using an SOI (silicon-on-insulator) substrate in place of a substrate formed of bulk silicon has been pursued in the art. This is because a device formed on the SOI substrate provides numerous advantages over a device formed on the bulk silicon substrate since it is possible to obtain high-speed operation due to a small junction capacitance, voltage reduction due to a low threshold voltage, and prevention of a latch-up phenomenon due to complete isolation.

A conventional SOI device includes an SOI substrate structure in which a buried oxide layer and a silicon layer are sequentially stacked on a silicon substrate, gates formed on the silicon layer of the SOI substrate, and junction regions formed in the silicon layer on both sides of the gates. Accordingly, the bodies of the SOI device are floated due to the presence of the junction regions and the buried oxide layer because the junction regions are formed such that the lower ends thereof contact the buried oxide layer.

Therefore, the SOI device has an FBC (floating body cell) structure in which the bodies are floated due to the presence of the junction regions and the buried oxide layer. In the SOI device having the FBC structure, it is not necessary to form capacitors and the size of cells can be decreased since charges can be stored in the floated bodies.

However, in the conventional SOI device, as the size of cells decreases to accommodate more highly integrated semiconductor devices, the volume of the bodies must also decrease, which causes the charge storage capacity of the bodies to degrade.

Additionally, in the conventional SOI device, the junction regions should be formed sufficiently deep to come into contact with the buried oxide layer in order to form the floated bodies. In this regard, a high dose ion implantation should be implemented to form the junction regions sufficiently deep. This causes the volume of the junction regions to increase. Consequently, a punch-through phenomenon is likely to occur between the junction regions that results in the deterioration of the operation characteristics of transistors.

SUMMARY OF THE INVENTION

Embodiments of the present invention are directed to an SOI device that can increase the charge storage capacity of transistor bodies and a method for manufacturing the same.

Embodiments of the present invention are also directed to an SOI device that can prevent a punch-through phenomenon from occurring between junction regions and a method for manufacturing the same.

In addition, embodiments of the present invention are directed to an SOI device that can improve the operation characteristics of transistors and a method for manufacturing the same.

In one embodiment of the present invention, an SOI device comprises an SOI substrate having a structure in which a buried oxide layer and a first silicon layer are sequentially stacked on a silicon substrate and possessing grooves which extend from an upper surface of the first silicon layer to a partial depth of the buried oxide layer; an insulation layer formed on surfaces of lower portions of the grooves; a second silicon layer formed to fill the grooves which have the insulation layer formed therein; gates formed on the second silicon layer; and junction regions formed in the first silicon layer on both sides of the gates to come into contact with the insulation layer.

Each of the grooves has a bulb-shaped section by including a vertical groove and a spherical groove which communicates with a lower end of the vertical groove.

The vertical groove is defined in an upper portion of the first silicon layer, and the spherical groove is defined in a lower portion of the first silicon layer and partially in the buried oxide layer.

The insulation layer comprises an oxide layer.

The second silicon layer comprises an epi-silicon layer.

The junction regions are formed to come into contact with the buried oxide layer.

In another embodiment of the present invention, a method for manufacturing an SOI device comprises the steps of defining grooves by etching a first silicon layer and a partial thickness of a buried oxide layer of an SOI structure having a structure in which the buried oxide layer and the first silicon layer are sequentially stacked on a silicon substrate; forming an insulation layer on surfaces of lower portions of the grooves; forming a second silicon layer to fill the grooves which have the insulation layer formed therein; forming gates on the second silicon layer; and forming junction regions in the first silicon layer on both sides of the gates to come into contact with the insulation layer.

Each of the grooves is defined to have a bulb-shaped section by including a vertical groove and a spherical groove which communicates with a lower end of the vertical groove.

The step of defining the grooves comprises the steps of defining vertical grooves by etching anisotropically an upper portion of the first silicon layer; and defining spherical grooves by etching isotropically a lower portion of the first silicon layer and a partial thickness of the buried oxide layer under the vertical grooves.

The insulation layer comprises an oxide layer.

The oxide layer is formed through an oxidation process.

The second silicon layer comprises an epi-silicon layer.

The epi-silicon layer is formed through an SEG process.

The junction regions are formed to come into contact with the buried oxide layer.

DESCRIPTION OF SPECIFIC EMBODIMENTS

Hereafter, specific embodiments of the present invention will be described in detail with reference to the accompanying drawings.

Figure 1:
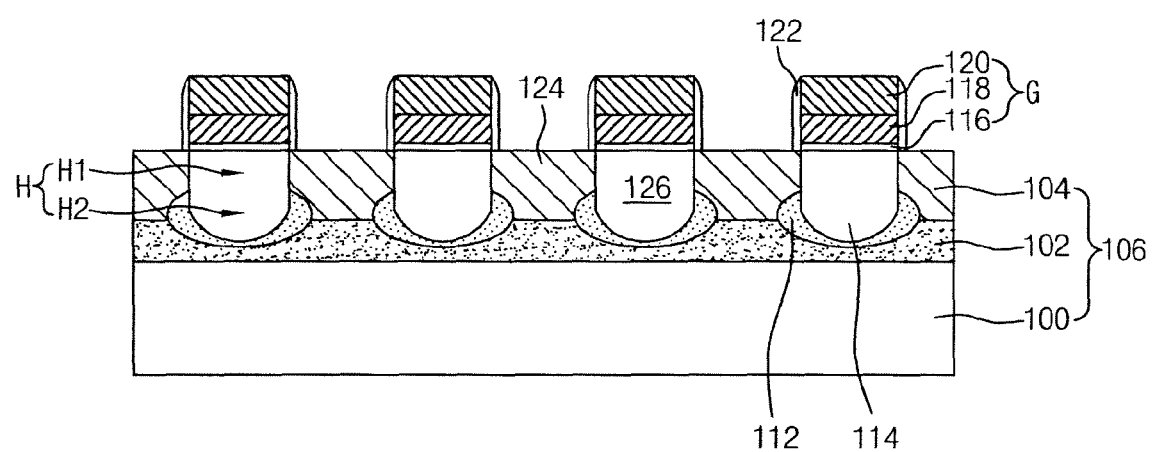
FIG. 1 is a sectional view showing an SOI device in accordance with one embodiment of the present invention.

FIG. 1 is a sectional view showing an SOI device in accordance with one embodiment of the present invention.

Referring to FIG. 1, an SOI substrate 106 having a stacked structure is prepared including a buried oxide layer 102 and a first silicon layer 104 sequentially stacked on a silicon substrate 100. Grooves H are defined in the SOI substrate 106 to have a depth extending from the upper surface of the first silicon layer 104 to a partial depth of the buried oxide layer 102, such that the partial depth is less than the thickness of the buried oxide layer 102. Each groove H has a bulbous-shaped section by forming a vertical groove H1 and a substantially spherical groove H2 mated to the lower end of the vertical groove H1. The vertical groove H1 is defined in the upper portion of the first silicon layer 104, and the substantially spherical groove H2 is defined in the lower portion of the first silicon layer 104 and partially in the buried oxide layer 102.

An insulation layer 112 is formed on the surfaces of the lower portions of the grooves H, i.e., the surfaces of the substantially spherical grooves H2. The insulation layer 112 may comprise an oxide layer. A second silicon layer 114 is formed to fill the grooves H that are formed having the insulation layer 112 on the surfaces of the lower portions thereof. The second silicon layer 114 comprises an epi-silicon layer.

Gates G are formed on the second silicon layer 114 and spacers 122 are formed on both sidewalls of the gates G. Each gate G has a stacked structure comprising a gate insulation layer 116, a gate conductive layer 118, and a gate hard mask layer 120. Junction regions 124 are formed in the first silicon layer 104 on both sides of the gates G. The junction regions 124 are formed to contact the insulation layer 112 and the buried oxide layer 102. As a result, transistor bodies 126 are floated due to the presence of the junction regions 124 and the buried oxide layer 102.

The portions of a second silicon layer 114 formed in the substantially spherical grooves H2 of the buried oxide layer 102 can be utilized as transistor bodies 126 since the SOI device according to an embodiment of the present invention is realized on an SOI substrate 106 including a buried oxide layer 102 having substantially spherical grooves. Accordingly, in the SOI device according to one embodiment of the present invention, the volume of the transistor bodies can be increased and an amount of charges stored in the bodies can be increased, whereby the charge storage capacity can be increased correspondingly.

FIGS. 2A through 2F are sectional views showing the processes for a method of manufacturing an SOI device in accordance with another embodiment of the present invention.

Figure 2A:
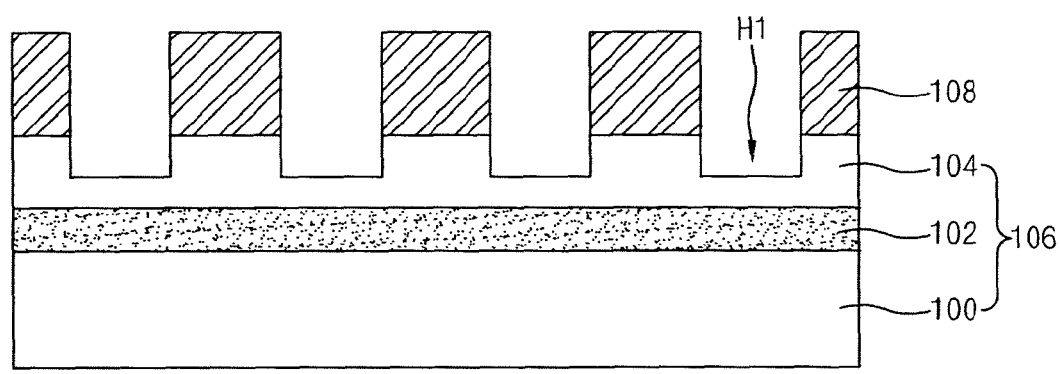
FIGS. 2A through 2F are sectional views showing the processes for a method of manufacturing an SOI device in accordance with another embodiment of the present invention.

Referring to FIG. 2A, an SOI substrate 106 is prepared having a buried oxide layer 102 and a first silicon layer 104 sequentially formed on a silicon substrate 100. Mask patterns 108 are formed on the first silicon layer 104 to expose portions of the first silicon layer 104. After the formation of the mask patterns 108, vertical first grooves H1 are defined by anisotropically etching the exposed portions of the first silicon layer 104 using the mask patterns 108 as an etch mask.

Figure 2B:
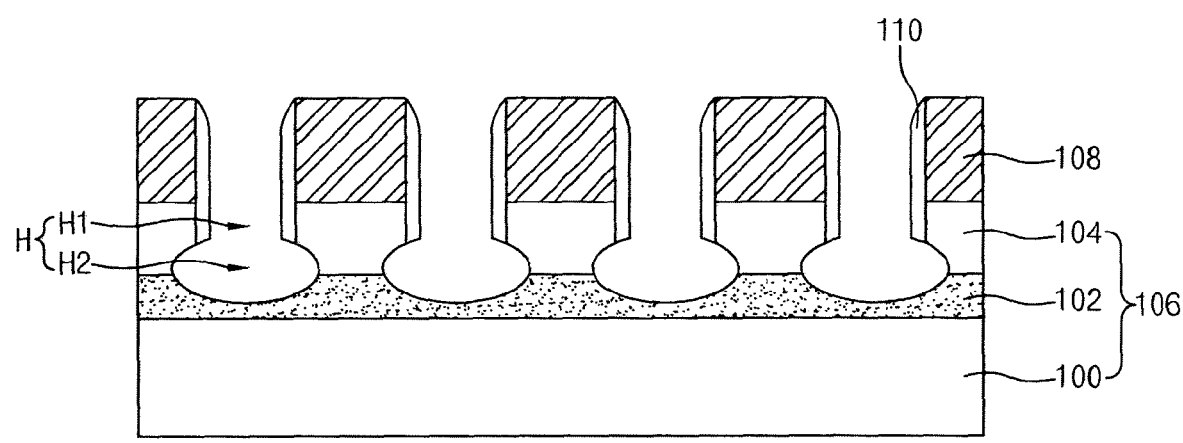

Referring to FIG. 2B, spacers 110 are formed on the sidewalls of the mask patterns 108 and the vertical first grooves H1. Substantially spherical second grooves H2 are defined by isotropically etching the lower portion of the first silicon layer 104 and a partial thickness of the buried oxide layer 102 under the vertical first grooves H1 using the mask patterns 108 and the spacers 110 as an etch mask. The partial thickness of the buried oxide layer 102 that is etched is less than that of the thickness of the buried oxide layer 102. As a result, bulbous-shaped grooves H are defined in the SOI substrate 106 having a depth that extends from the upper surface of the first silicon layer 104 to a partial depth of the buried oxide layer 102.

Figure 2C:
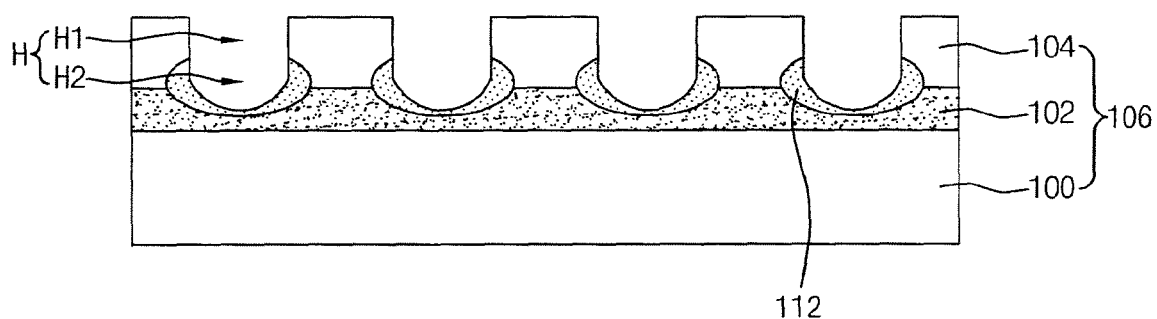

Referring to FIG. 2C, the mask patterns 108 and the spacers 110 are removed through a process well known in the art. An insulation layer 112 is formed on portions of the buried oxide layer 102 and the inner surfaces of the lower portions of the first silicon layer 104 defined by the substantially spherical second grooves H2. That is, the insulation layer 112 is formed on the surfaces of the substantially spherical second grooves H2. The insulation layer 112 is formed as an oxide layer through an oxidation process.

Figure 2D:
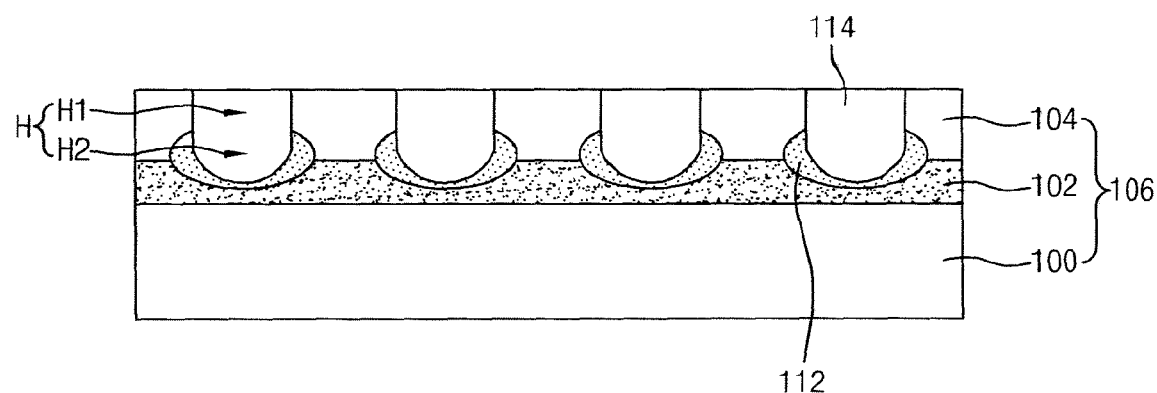

Referring to FIG. 2D, a second silicon layer 114 is formed to fill the bulbous-shaped grooves H that include the vertical first grooves H1 and the spherical second grooves H2 having the insulation layer 112 formed on the surfaces thereof. The second silicon layer 114 may be formed of an epi-silicon layer. The second silicon layer 114 comprising the epi-silicon layer is formed by growing an epi-silicon layer through an SEG (selective epitaxial growth) process and by then CMP-ing (chemically and mechanically polishing) or etching back the epi-silicon layer until the first silicon layer 104 is exposed.

Figure 2E:
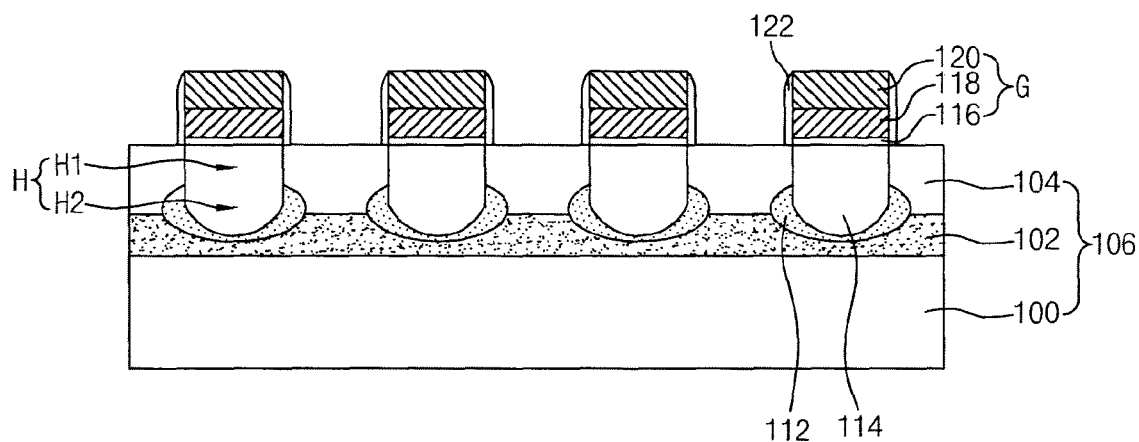

Referring to FIG. 2E, a gate insulation layer 116, a gate conductive layer 118, and a gate hard mask layer 120 are sequentially formed on the first and second silicon layers 104 and 114. Gates G are formed on the second silicon layer 114 by etching the gate hard mask layer 120, the gate conductive layer 118, and the gate insulation layer 116. Gate spacers 122 are then formed on both sidewalls of the gates G.

Figure 2F:
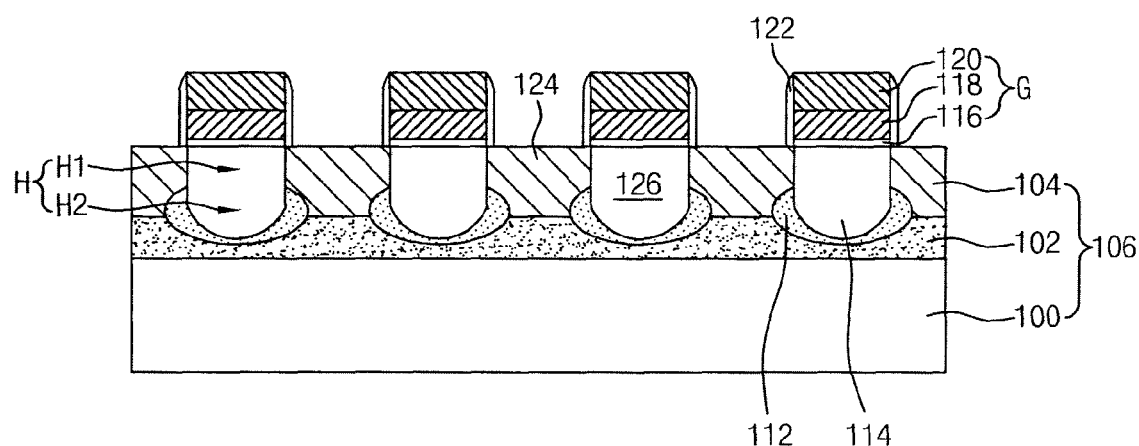

Referring to FIG. 2F, junction regions 124 are formed in the first silicon layer 104 on both sides of the gates G including the gate spacers 122 to contact the insulation layer 112. The junction regions 124 may be formed through an ion implantation process. The junction regions 124 are formed to additionally contact the buried oxide layer 102. As a result, transistor bodies 126 of the SOI device are floated due to the presence of the junction regions 124 and the buried oxide layer 102.

Thereafter, while not shown in the drawings, the manufacture of an SOI device according to an embodiment of the present invention is completed by sequentially conducting a series of subsequent processes well known in the art.

As is apparent from the above description, according to the present invention, the volume of the transistor bodies of the SOI device can be increased as compared to the conventional art by forming an epi-silicon layer in grooves that are defined in an SOI substrate. As a result, an increased amount of charges can be stored in the transistor bodies having the increased volumes. Accordingly, according to the present invention, the charge storage capacity of the SOI device can be effectively increased.

In addition, according to the present invention, a sensing margin can also be improved and the threshold voltage of transistors can be decreased since the charge storage capacity of the SOI device can be increased.

Moreover, according to the present invention, the depth needed for the junction regions to float the transistor bodies can be decreased as compared to the conventional art due to the fact that an insulation layer is formed on the lower portions of the grooves and junction regions are formed to contact the insulation layer. Accordingly, in the present invention, it is possible to prevent a punch-through phenomenon from occurring between the junction regions, whereby the operation characteristics of the transistors can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing an SOI device, comprising the steps of:
    defining grooves in an SOI substrate having a stacked structure by etching a first silicon layer and a partial thickness of a buried oxide layer of the SOI substrate, wherein the SOI substrate has a structure including the buried oxide layer and the first silicon layer sequentially stacked on a silicon substrate wherein each of the grooves is defined to have a bulbous-shaped section by forming the grooves using a vertical shaped groove and a substantially spherical shaped groove that is mated to a lower end of the vertical shaped groove such that the spherical shaped groove is defined in a lower portion of the first silicon layer and partially in the buried oxide layer;
    forming an insulation layer on surfaces of the spherical shaped groove while selectively forming the insulation layer only on the lower end of the vertical shaped groove while a spacer is on an upper end of the vertical shaped groove which prevents the insulation layer from being formed on the upper end of the vertical shaped groove;
    forming a second silicon layer as a body of the SOI device to fill the grooves that have the insulation layer formed therein;
    forming gates on the second silicon layer; and
    forming junction regions in the first silicon layer on both sides of the gates to contact the insulation layer and the buried oxide layer of the SOI substrate, thus the second silicon layer is floated by the presence of the junction regions and the buried oxide layer.

2. The method according to claim 1, wherein the step of defining the grooves comprises the steps of:
    defining the vertical shaped grooves by anisotropically etching an upper portion of the first silicon layer; and
    defining substantially the spherical shaped grooves by isotropically etching a lower portion of the first silicon layer and a portion of the buried oxide layer beneath the vertical shaped grooves.

3. The method according to claim 1, wherein the insulation layer comprises an oxide layer.

4. The method according to claim 1, wherein the second silicon layer comprises an epi-silicon layer.

5. The method according to claim 3, wherein the oxide layer is formed through an oxidation process.

6. The method according to claim 4, wherein the epi-silicon layer is formed through an SEG process.

* * * * *